(12) United States Patent
Lee et al.

(10) Patent No.: US 10,943,878 B2
(45) Date of Patent: Mar. 9, 2021

(54) SEMICONDUCTOR PACKAGE

(71) Applicant: SAMSUNG ELECTRO-MECHANICS CO., LTD., Suwon-si (KR)

(72) Inventors: Yun Tae Lee, Suwon-si (KR); Han Kim, Suwon-si (KR); Hyung Joon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/586,529

(22) Filed: Sep. 27, 2019

(65) Prior Publication Data

US 2020/0411461 A1  Dec. 31, 2020

(30) Foreign Application Priority Data

Jun. 25, 2019  (KR) .................. 10-2019-0075393

(51) Int. Cl.
*H01L 23/48* (2006.01)
*H01L 23/00* (2006.01)
*H01L 23/495* (2006.01)

(52) U.S. Cl.
CPC ............ *H01L 24/09* (2013.01); *H01L 23/481* (2013.01); *H01L 23/49527* (2013.01); *H01L 23/49531* (2013.01); *H01L 2224/02331* (2013.01); *H01L 2224/02377* (2013.01); *H01L 2224/02379* (2013.01)

(58) Field of Classification Search
None
See application file for complete search history.

(56) References Cited

U.S. PATENT DOCUMENTS

| | | | |
|---|---|---|---|
| 8,531,012 B2 | 9/2013 | Lee et al. | |
| 9,831,148 B2 * | 11/2017 | Yu | ................ H01L 23/3128 |
| 2010/0237481 A1 | 9/2010 | Chi et al. | |
| 2017/0287796 A1 | 10/2017 | Lee et al. | |
| 2017/0309571 A1 * | 10/2017 | Yi | ...................... H04L 24/20 |
| 2019/0096862 A1 | 3/2019 | Yu et al. | |
| 2019/0115300 A1 | 4/2019 | Yu et al. | |
| 2019/0131242 A1 | 5/2019 | Lee et al. | |

FOREIGN PATENT DOCUMENTS

| | | |
|---|---|---|
| KR | 10-2010-0105506 | 9/2010 |
| KR | 10-1922875 B1 | 11/2018 |
| KR | 10-1939046 B1 | 1/2019 |

* cited by examiner

*Primary Examiner* — Robert K Carpenter
(74) *Attorney, Agent, or Firm* — Morgan, Lewis & Bockius LLP

(57) ABSTRACT

A semiconductor package includes a frame having a recess on which a stopper layer is disposed, a semiconductor chip including a body having a first surface on which a connection pad is disposed and a second surface opposing the first surface, and a through-via penetrating through at least a portion of a region between the first surface and the second surface, the second surface facing the stopper layer, an encapsulant covering at least a portion of each of the frame and the semiconductor chip and filling at least a portion of the recess, a first connection structure disposed on a lower side of the frame and on the first surface of the semiconductor chip and including a first redistribution layer, and a second connection structure disposed on an upper side of the frame and on the second surface of the semiconductor chip and including a second redistribution layer.

20 Claims, 10 Drawing Sheets

SEMICONDUCTOR PACKAGE

CROSS-REFERENCE TO RELATED APPLICATION(S)

This application claims the benefit under 35 USC 119(a) of Korean Patent Application No. 10-2019-0075393 filed on Jun. 25, 2019 in the Korean Intellectual Property Office, the entire disclosure of which is incorporated herein by reference for all purposes.

BACKGROUND

The present inventive concept relates to a semiconductor package.

As smart electronic devices have recently been developed, the specifications of components used in such devices have been also increasing. For example, the specification of an application processor (AP), a core chip of smart electronic devices, is rapidly developing. The AP, a core component of smart devices, is packaged in various manners.

SUMMARY

An aspect of the present inventive concept is to provide a semiconductor package in which a yield may be improved and manufacturing costs may be reduced.

An aspect of the present inventive concept is to provide a semiconductor package in which an optimized signal line may be designed.

According to an aspect of the present inventive concept, a frame including a plurality of wiring layers and having a recess in the form of a blind cavity is introduced, and a semiconductor chip is disposed in the frame to be packaged.

Another to another aspect of the present inventive concept, through-vias are formed in a semiconductor chip, and a redistribution layer including a signal pattern, a power pattern and/or a ground pattern is respectively disposed above and below the semiconductor chip.

According to an aspect of the present inventive concept, a semiconductor package includes a frame having a plurality of wiring layers electrically connected to each other and having a recess on which a stopper layer is disposed; a semiconductor chip including a body having a first surface on which a connection pad is disposed and a second surface opposing the first surface, and a through-via penetrating through at least a portion of a region between the first surface and the second surface of the body, the second surface facing the stopper layer; an encapsulant covering at least a portion of each of the frame and the semiconductor chip and filling at least a portion of the recess; a first connection structure disposed on a lower side of the frame and on the first surface of the semiconductor chip and including a first redistribution layer; and a second connection structure disposed on an upper side of the frame and on the second surface of the semiconductor chip and including a second redistribution layer.

According to an aspect of the present inventive concept, a semiconductor package includes a first connection structure and a second connection structure each having one or more redistribution layers; a frame disposed between the first and second connection structures, and having a recess exposing a conductive layer partially embedded in the second connection structure; a semiconductor chip disposed in the recess, and including a body having a first surface on which connection pads are disposed and a second surface opposing the first surface, and a through-via penetrating through the body and connected to the conductive layer through an electrical connection member disposed between the through via and the conductive layer, the second surface facing the stopper layer; and an encapsulant filling at least a portion of the recess, and disposed between the second surface and the conducive layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
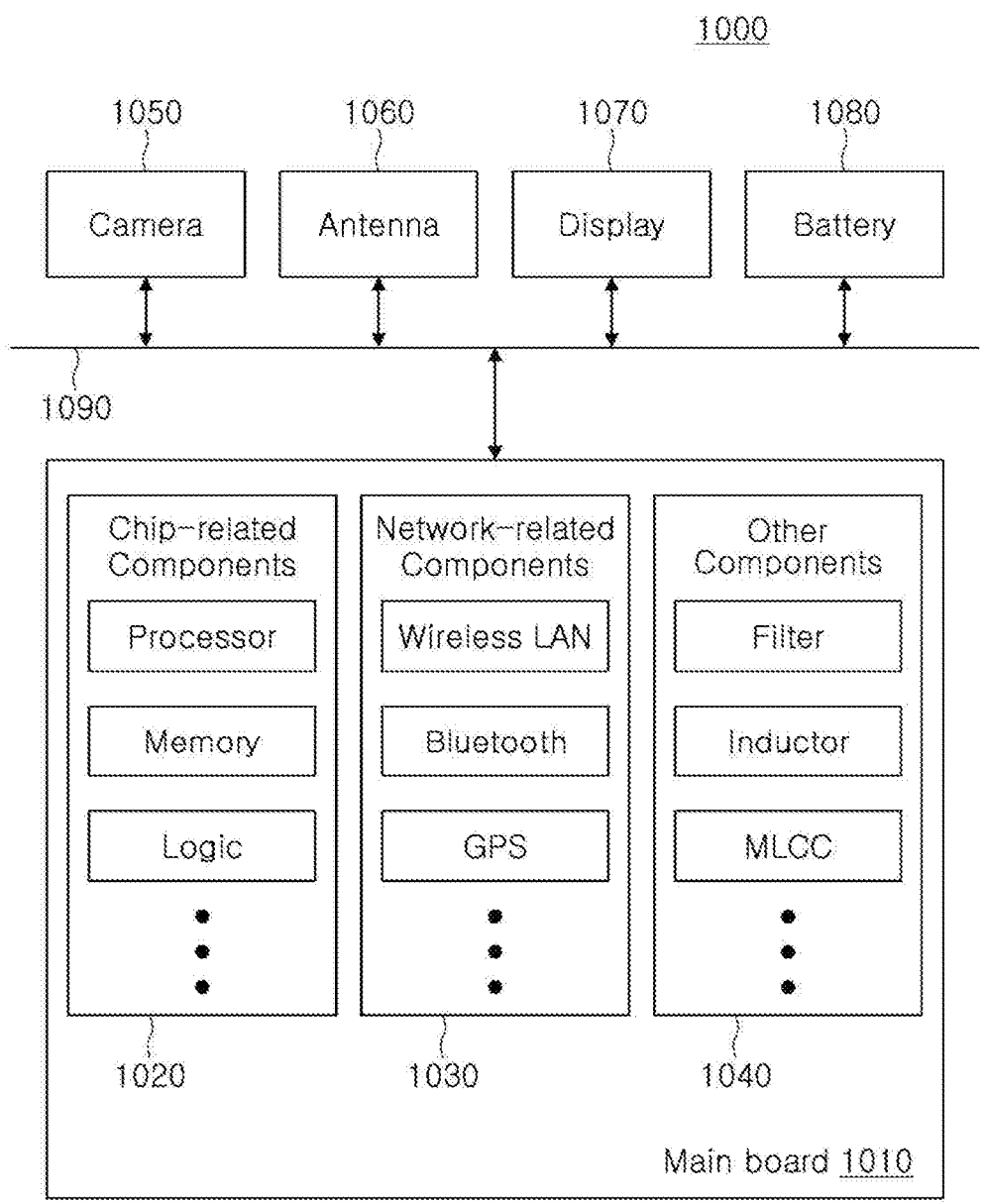
FIG. 1 is a schematic block diagram illustrating an example of an electronic device system.

Hereinafter, examples of the present inventive concept will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
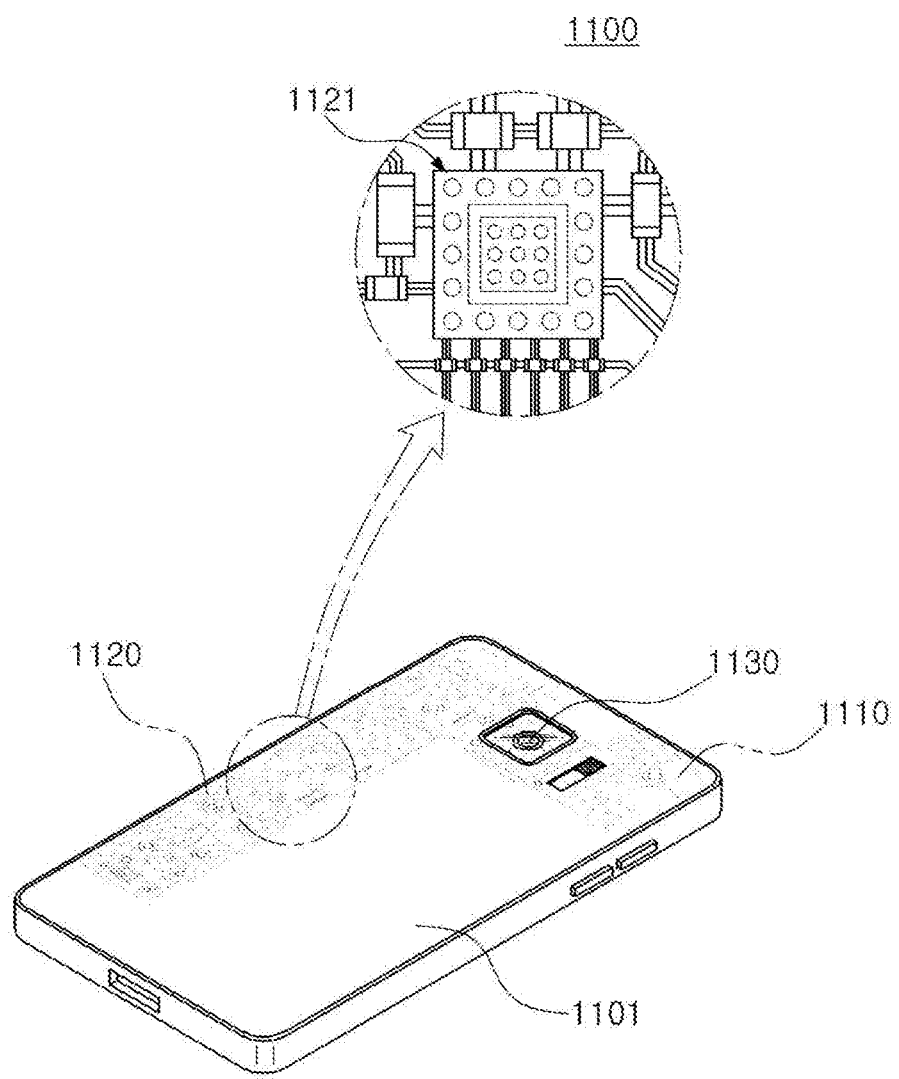
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a motherboard or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

In this case, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
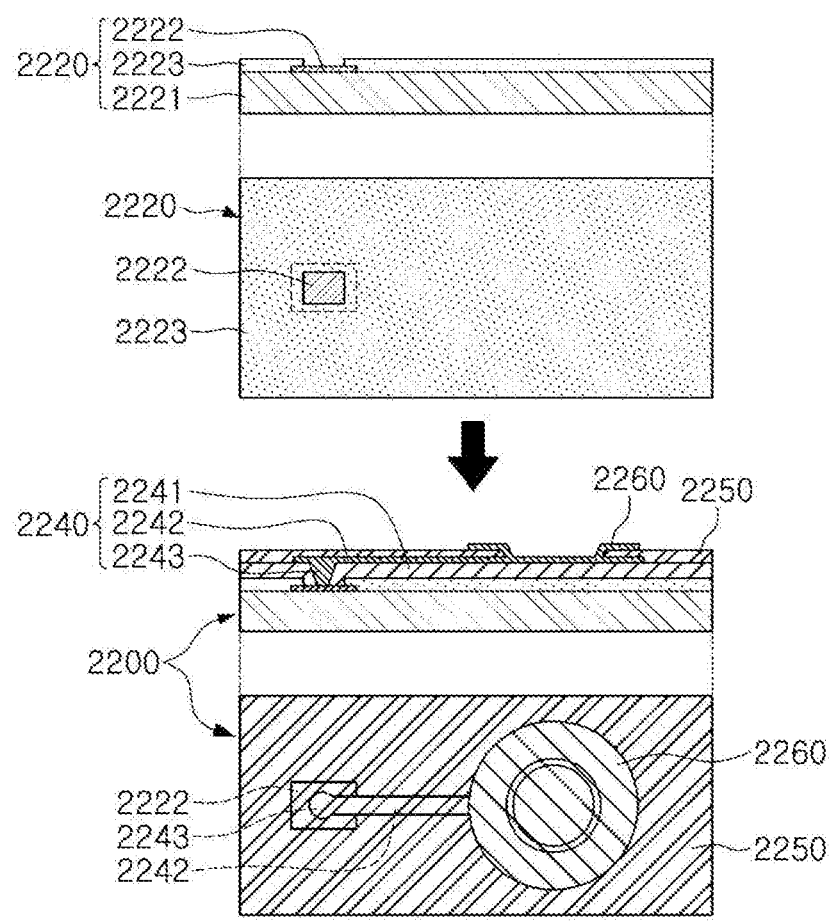
FIGS. 3A and 3B are schematic cross-sectional views illustrating states of a fan-in semiconductor package before and after being packaged.
Figure 3B:
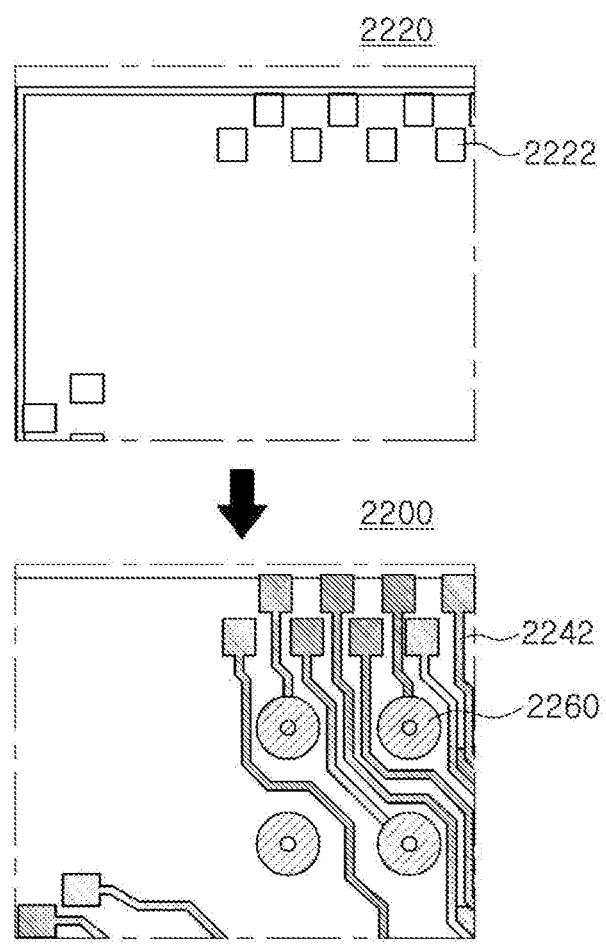

FIGS. 3A and 3B are schematic cross-sectional views illustrating states of a fan-in semiconductor package before and after being packaged.

Figure 4:
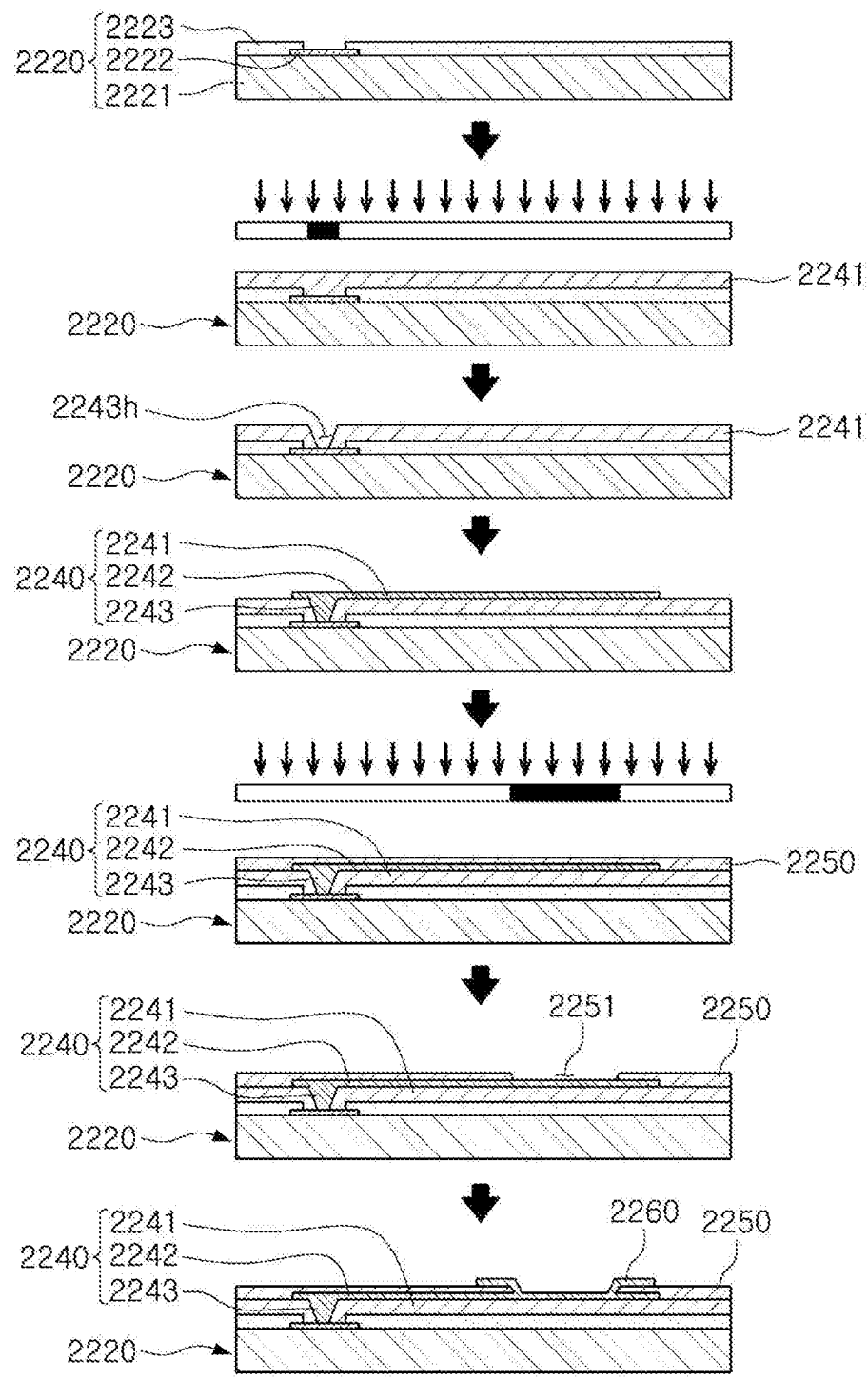
FIG. 4 is a schematic cross-sectional view illustrating a packaging process of a fan-in semiconductor package.

FIG. 4 is a schematic cross-sectional view illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Thus, a connection member 2240 may be formed on the semiconductor chip 2220, to comply with a size of the semiconductor chip 2220, to redistribute the connection pad 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 may be formed to protect the connection member 2240, an opening 2251 may be formed, and then, an under-bump metal layer 2260 and the like may be formed. In detail, through a series of processes, a fan-in semiconductor package 2200 including, for example, the semiconductor chip 2220, the connection member 2240, the passivation layer 2250, and the under-bump metal layer 2260 may be manufactured.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
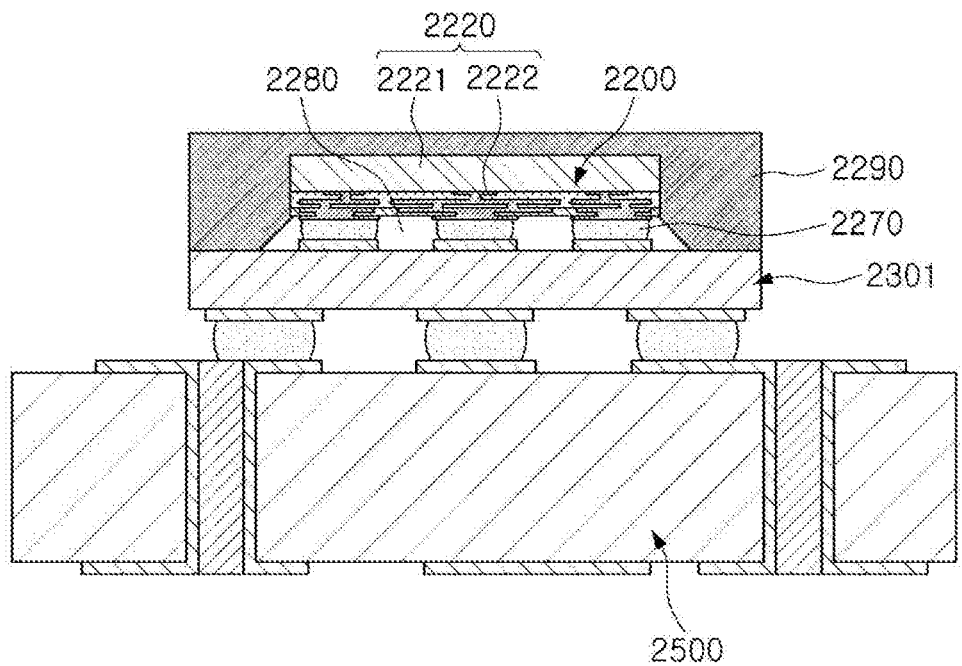
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
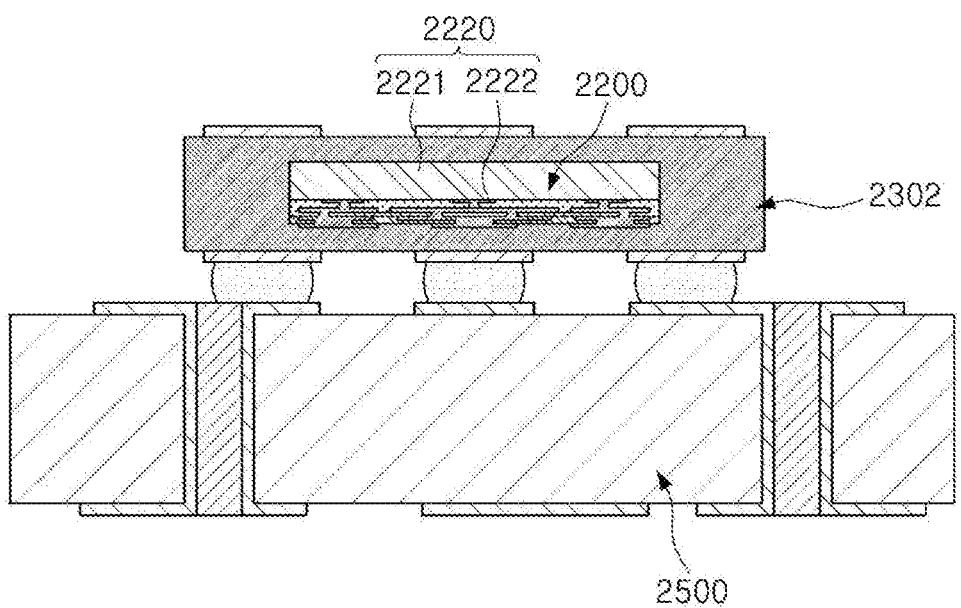
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the PCB 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate PCB 2302, connection pads 2222, that is, I/O terminals, of the semiconductor chip 2220 may be redistributed by the PCB 2302 in a state in which the fan-in semiconductor package 2200 is embedded in the PCB 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate PCB and be then mounted on the mainboard of the electronic device through a packaging process or may be mounted and used on the mainboard of the electronic device in a state in which it is embedded in the PCB.

Fan-Out Semiconductor Package

Figure 7:
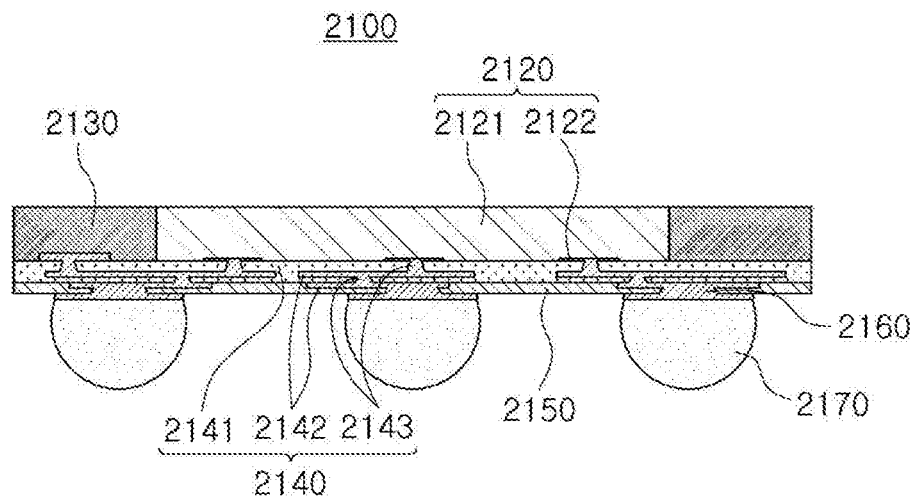
FIG. 7 is a schematic cross-sectional view illustrating a fan-out semiconductor package.

FIG. 7 is a schematic cross-sectional view illustrating a fan-out semiconductor package With reference to FIG. 7, in the case of a fan-out semiconductor package 2100, for example, an outer side of a semiconductor chip 2120 may be protected by an encapsulant 2130, and a connection pad 2122 of the semiconductor chip 2120 may be redistributed outwardly of the semiconductor chip 2120 by a connection member 2140. In this case, a passivation layer 2150 may further be formed on the connection member 2140, and an under bump metal layer 2160 may further be formed in openings of the passivation layer 2150. Solder balls 2170 may further be formed on the under bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may be formed in a form in which I/O terminals are redistributed to the outside of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate PCB, as described below.

Figure 8:
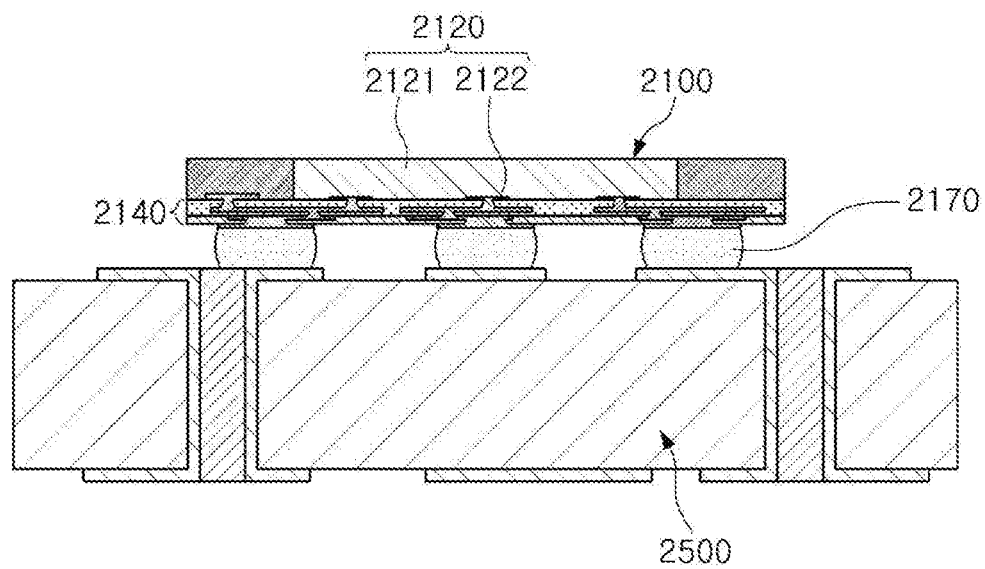
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate PCB, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Although the semiconductor package in the present inventive concept basically refers to a package technology for protecting a semiconductor chip from an external impact, to mount a semiconductor chip on a main board of an electronic device or the like, the content of the semiconductor package in the present inventive concept may also be expanded and applied to the structure of a component-embedded board or the like.

Figure 9:
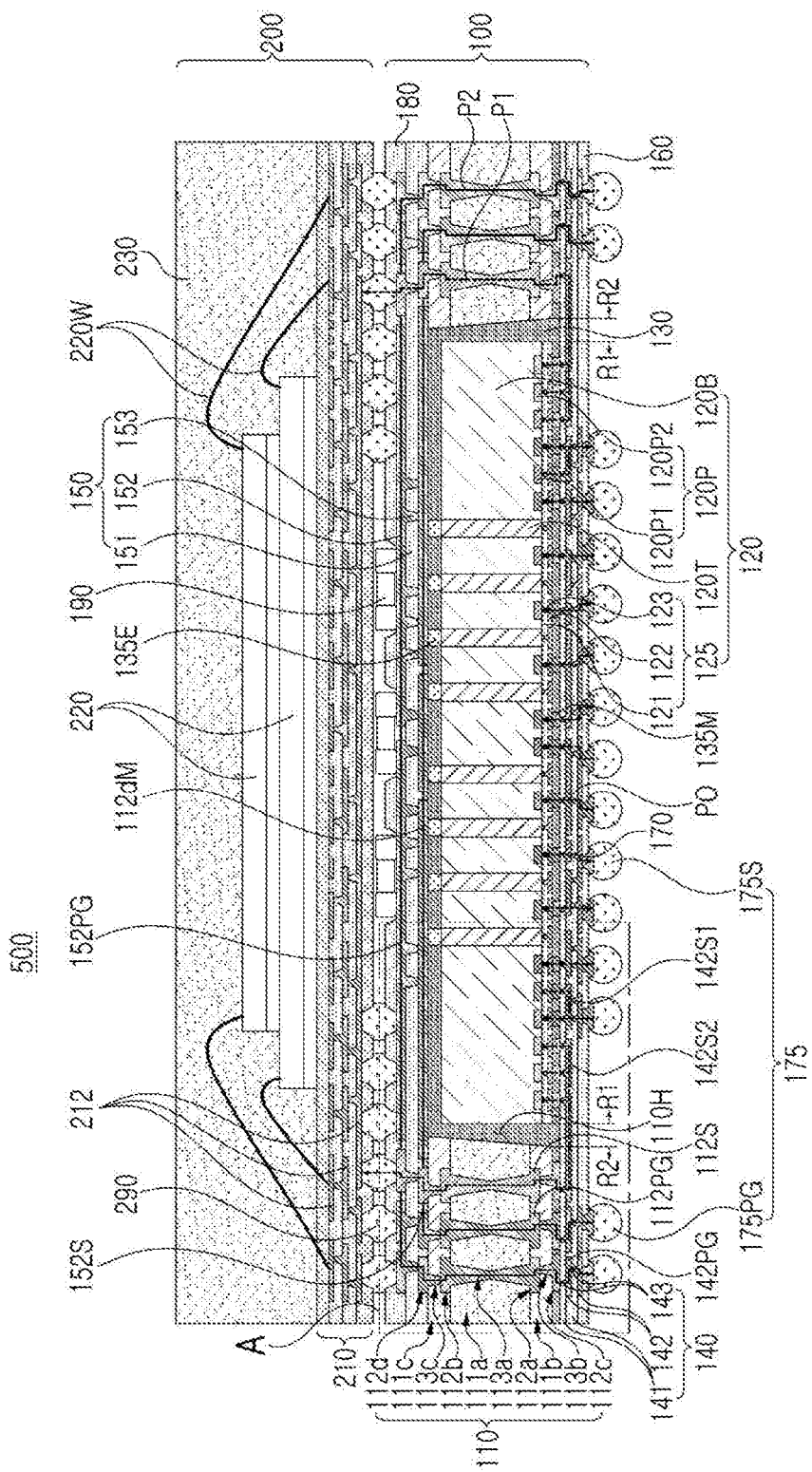
FIG. 9 is a cross-sectional view schematically illustrating an example of a semiconductor package.

FIG. 9 is a cross-sectional view schematically illustrating an example of a semiconductor package.

Figure 10:
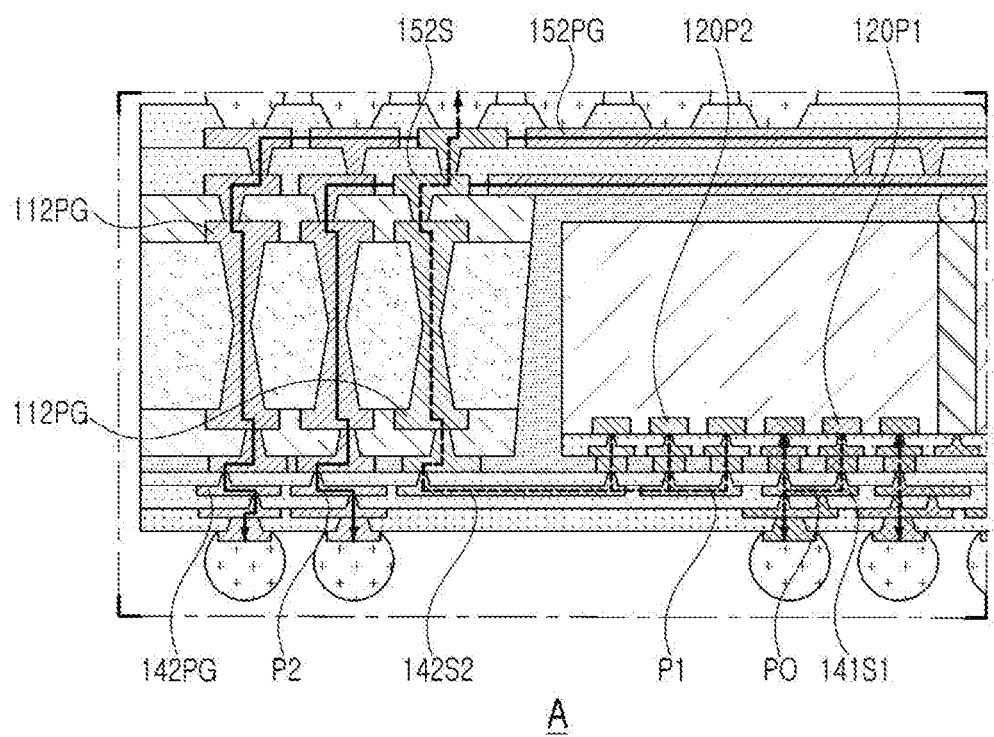
FIG. 10 is a cross-sectional view schematically illustrating region A of the semiconductor package of FIG. 9.

FIG. 10 is a cross-sectional view schematically illustrating region A of the semiconductor package of FIG. 9.

Figure 11:
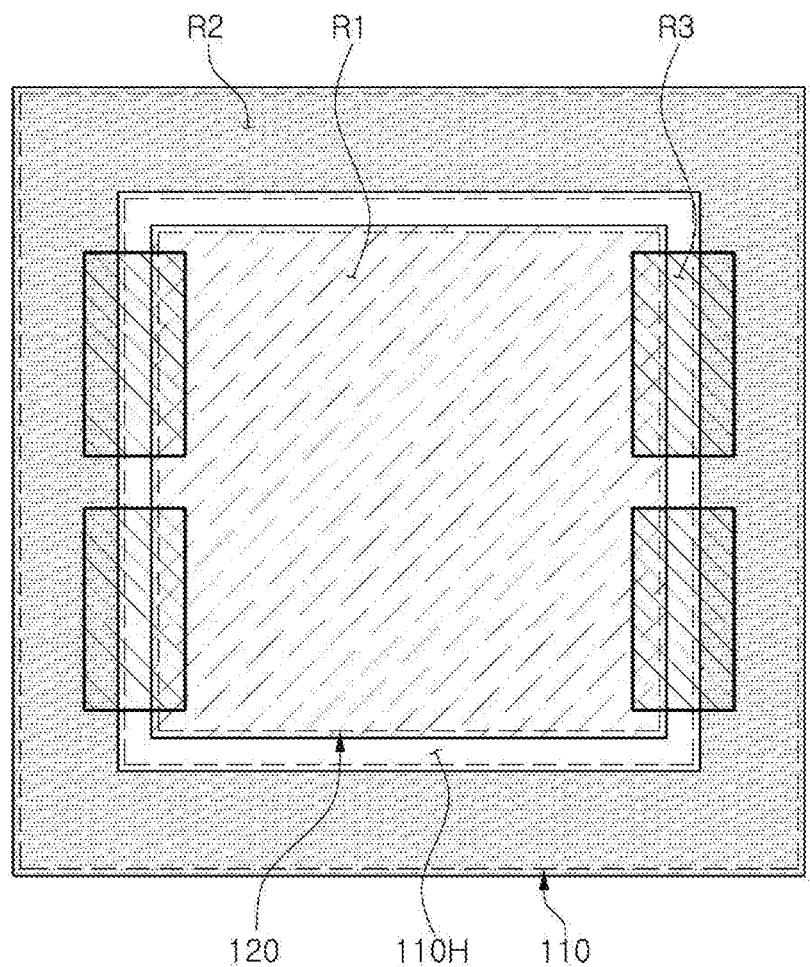
FIG. 11 is a plan view schematically illustrating a planar region of a first connection structure of the semiconductor package of FIG. 9.

FIG. 11 is a plan view schematically illustrating a planar region of a first connection structure of the semiconductor package of FIG. 9.

Referring to FIGS. 9 to 11, a semiconductor package 500 according to an example includes a first package structure 100. For example, the semiconductor package 500 according to an example may be the first package structure 100 itself. Optionally, the semiconductor package 500 according to an example may further include a second package structure 200 disposed on the first package structure 100. The second package structure 200 may be mounted on the first package structure 100 in the form of a POP, using a second electrical connection metal 290 or the like. For example, the semiconductor package 500 according to an example may be a POP structure including the first and second package structures 100 and 200.

The first package structure 100 includes a frame 110 having a plurality of wiring layers 112a, 112b, 112c and 112d electrically connected to each other and having a recess 110H on which a stopper layer 112dM is disposed, a semiconductor chip 120 including a body 120B having a first surface on which a connection pad 120P is disposed and a second surface opposing the first surface, and through-vias 120T penetrating through at least a portion of a region between the first surface and the second surface of the body 120B, the semiconductor chip 120 being disposed in the recess 110H in such a manner that the second surface faces the stopper layer 112dM, an encapsulant 130 covering at least a portion of each of the frame 110 and the semiconductor chip 120 and filling at least a portion of the recess 110H, a first connection structure 140 disposed on a lower side of the frame 110 and on the first surface of the semiconductor chip 120 and including one or more first redistribution layers 142, and a second connection structure 150 disposed on an upper side of the frame 110 and on the second surface of the semiconductor chip 120 and including one or more second redistribution layers 152. A first passivation layer 160, an under bump metal 170, a first electrical connection metal 175 may be further disposed below the first connection structure 140 as required. Further, a second passivation layer 180 may be further disposed on an upper side of the second connection structure 150. Further, a passive component 190 may be further disposed on an upper side of the second connection structure 150.

The semiconductor package 500 according to an example includes the frame 110 in which the first package structure 100 has the recess 110H in the form of a blind by the stopper layer 112dM. Therefore, a yield may be improved and a manufacturing cost may be reduced. For example, when the frame 110 includes the recess 110H having the form as described above, a portion or the entirety of the second connection structure 150 disposed on a backside with respect to the semiconductor chip 120 may be formed before an arrangement of the semiconductor chip 120. In this case, even in a case in which a failure occurs in a manufacturing process of the frame 110 and/or the second connection structure 150, it may not affect the semiconductor chip 120 which is relatively expensive. As a result, the yield may be improved and the cost may be reduced.

In the semiconductor package 500 according to an example, the first package structure 100 includes the semiconductor chip 120 in which the through-vias 120T are formed. The first connection structure 140 and the second connection structure 150 are disposed below and above the semiconductor chip 120, respectively. Therefore, an optimized signal line may be designed through such arrangement and configuration. For example, the first connection structure 140 may include a first region R1 overlapping the semiconductor chip 120 on a plane, and a second region surrounding the first region R1 and overlapping the frame 110 on a plane. In this case, signal patterns 142S1 and 142S2 may be mainly designed in the first redistribution layer 142 in the first region R1 corresponding to a fan-in region, and power and/or ground patterns 142PG may be mainly designed in the first redistribution layer 142 in the second region R2 corresponding to a fan-out region. In addition, power and/or ground patterns 152PG may be mainly designed by the second redistribution layer 152 of the second connection structure 150. In this case, 'the pattern being mainly designed' means that it is designed to occupy an area of 50% or more or an area of 90% or more, on a planar basis. In this case, connection pads 120P1 and 120P2 for signal connection among the connection pads 120P of the semiconductor chip 120 may be redistributed through the signal patterns 142S1 and 142S2 of the first redistribution layer 142. In addition, the power and/or ground of the semiconductor chip 120 may be electrically connected to the power and/or ground patterns 152PG of the second redistribution layer 152 through the through-vias 120T and may thus be redistributed. In this case, the connection pad 120P of the semiconductor chip 120 may be designed mainly for signal connection. Also, the connection pads 120P1 and 120P2 for signal connection may be redistributed through the signal patterns 142S1 and 142S2 disposed in the region corresponding to the fan-in region of the first redistribution layer 142. As a result, an optimized signal line may be designed.

The first redistribution layer 142 may include a first signal pattern 142S1 in the first region R1, may include a second signal pattern 142S2 in a region R3 extending from the first region R1 to the second region R2, and may include power and/or ground patterns 142PG in the second region R2. The connection pad 120P may include a first connection pad 120P1 electrically connected to the first signal pattern 142S1, and a second connection pad 120P2 electrically connected to the second signal pattern 142S2. The first connection pad 120P1 may be redistributed in the first region R1 through the first signal pattern 142S1. The second connection pad 120P2 may be redistributed from the first region R1 to the second region R2 through the second signal pattern 142S2. In the first connection structure 140, the first and second signal patterns 142S1 and 142S2 may be disconnected from each other, and for example, may not be connected to each other within the first connection structure 140. The first signal pattern 142S1 may be a pattern for signal connection between the semiconductor chip 120 and an external semiconductor chip and/or component. The second signal pattern 142S2 may be a pattern for signal connection between the semiconductor chip 120 and a semiconductor chip 220 of the second package structure 200 to be described later.

In this case, the first connection pad 120P1 may be redistributed through a path PO passing through the first signal pattern 142S1 in the first region, for example, vertically. The second connection pad 120P2 and a signal pattern 152S of the second redistribution layer 152 may be electrically connected to each other by an electrical path P1 passing through the second signal pattern 142S2 and the plurality of wiring layers 112a, 112b, 112c and 112d in order, or vice versa. In addition, the power and/or ground patterns 142PG of the second region R2 of the first redistribution layer 142 and the through-vias 120T of the semiconductor chip 120 are electrically connected to each other by an electrical path P2 passing through power and/or ground patterns 112PG of the plurality of wiring layers 112a, 112b, 112c and 112d, the power and/or ground patterns 152PG of the second redistribution layer 152 and the stopper layer 112dM in order or vice versa. In this manner, the first and second signal patterns 142S1 and 142S2 may be separately designed depending on functions thereof, and thus, an optimum electrical path may be provided. Also, power and/or ground of the semiconductor chip 120 may be redistributed through a backside path of the semiconductor chip 120. As a result, an optimized signal line may be designed more effectively.

The passive component 190 is disposed between the first and second package structures 100 and 200. For example, the passive component 190 may be surface mounted on the second second connection member 150. The passive component 190 may be electrically connected to power and/or ground patterns 152PG of the second redistribution layer 152, and may thus be electrically connected to the electrical path P2 for power and/or ground as described above, thereby providing more stable electrical characteristics to the electrical path P2 for power and/or ground.

The first electrical connection metal 175 may include a 1-1 electrical connection metal 175S disposed in a region overlapping the first region R1 on a plane and electrically connected to the first signal pattern 142S1, and a 1-2 electrical connection metal 175PG disposed in a region overlapping the second region R2 on a plane and electrically connected to the power and/or ground pattern 142PG of the second region R2. Thus, a signal may be electrically connected to an electronic device or the like mainly in a fan-in region, and the power and/or ground may be electrically connected to an electronic device or the like in a fan-out region.

The semiconductor chip 120 may be a System on Chip (SoC)-type application processor (AP) chip, including a central processing unit (CPU), a graphics processing unit (GPU), a neural processing unit (NPU), a digital signal processor unit (DSPU), and/or an image signal processor unit (ISPU) as a core unit. Even when an AP chip is used as the semiconductor chip 120, an optimized signal line may be designed through the above-described wiring design and arrangement or the like. Therefore, the semiconductor package 500 according to an example may be easily applied to an electronic device that requires a relatively high specification.

The semiconductor chip 120 may further include a redistribution structure 125 disposed on the first surface of the body 120B and including one or more third redistribution layers 122. The connection pad 120P and the through-vias 120T may be electrically connected to at least a portion of the one or more third redistribution layers 122. As a result, the connection pad 120P may be primarily redistributed through the third redistribution layers 122, and power and/or ground lines inside the body 120B may be common with each other through the third redistribution layers 122 and may then be redistributed to the backside of the semiconductor chip 120 through the through-vias 120T. At least a portion of sides of the body 120B may be substantially coplanar with at least a portion of sides of the redistribution structure 125. The encapsulant 130 may cover at least a portion of the side of the body 120B and at least a portion of the side of the redistribution structure 125. As described above, the semiconductor chip 120 may be a packaged die having a redistribution region even in a chip state.

A metal member 135M may be disposed between the redistribution structure 125 and the first connection structure 140. The metal member 135M may electrically connect the first and third redistribution layers 142 and 122. The metal member 135M may include a known metal material such as copper (Cu). The redistribution structure 125 may be separated from the first connection structure 140 by a predetermined distance by the metal member 135M. The encapsulant 130 may be disposed between the redistribution structure 125 and the first connection structure 140 to cover at least a portion of a side surface of the metal member 135M.

An electrical connection member 135E may be disposed between the second surface of the semiconductor chip 120 and the stopper layer 112dM. The electrical connection member 135E may electrically connect the through-vias 120T and the stopper layer 112dM. The electrical connection member 135E may include a low melting point metal such as tin (Sn) or an alloy containing tin (Sn). For example, the electrical connection member 135E may be a solder ball, a solder bump or the like. The second surface of the semiconductor chip 120 and the stopper layer 112dM may be separated from each other by a predetermined distance by the electrical connection member 135E. The encapsulant 130 may be disposed between the second surface of the semiconductor chip 120 and the stopper layer 112dM to cover at least a portion of a side surface of the electrical connection member 135E.

The second package structure 200 includes a semiconductor chip 220. The semiconductor chip 220 of the second package structure 200 may be a memory chip 220. For example, the second package structure 200 may be a memory structure 200 that includes at least one memory chip 220. The memory structure 200 may include, for example, a circuit board 210 including one or more circuit layers 212, at least one memory chip 220 disposed above the circuit board 210 and electrically connected to the circuit layer 212 through a bonding wire 220W, a molding material 230 covering at least a portion of the memory chip 220, and a second electrical connection metal 290 disposed below the circuit board 210 and electrically connected to the circuit layer 212.

The semiconductor package 500 according to an example may be configured in such a manner that the semiconductor chip 220 of the second package structure 200 is electrically connected to the second redistribution layer 152 of the second connection structure 150 of the first package structure 100 through the second electrical connection metal 290 or the like. In this case, the semiconductor chip 220 may be the memory chip 220 as described above, and the memory chip 220 may be electrically connected to the signal pattern 152S of the second redistribution layer 152 of the second connection structure 150 through the above path, and as a result, may be electrically connected to the electrical path P1 for a signal as described above, and may thus be electrically connected to the second connection pad 120P2 of the semiconductor chip 120 that may be an AP chip or the like, through an optimal path.

Hereinafter, respective configurations of the semiconductor package 500 according to an example will be described in detail with reference to the drawings.

The first package structure 100 includes the frame 110 having a plurality of wiring layers 112a, 112b, 112c and 112d electrically connected to each other and having a recess 110H on which a stopper layer 112dM is disposed, a semiconductor chip 120 including a body 120B having a first surface on which a connection pad 120P is disposed and a second surface opposing the first surface, and through-vias 120T penetrating through at least a portion of a region between the first surface and the second surface of the body 120B, the semiconductor chip 120 being disposed in the recess 110H in such a manner that the second surface faces the stopper layer 112dM, an encapsulant 130 covering at least a portion of each of the frame 110 and the semiconductor chip 120 and filling at least a portion of the recess 110H, a first connection structure 140 disposed on a lower side of the frame 110 and on the first surface of the semiconductor chip 120 and including one or more first redistribution layers 142, and a second connection structure 150 disposed on an upper side of the frame 110 and on the second surface of the semiconductor chip 120 and including one or more second redistribution layers 152. A first passivation layer 160, an under bump metal 170, a first electrical connection metal 175 may be further disposed below the first connection structure 140 as required. Further, a second passivation layer 180 may be further disposed on an upper side of the second connection structure 150. Further, a passive component 190 may be further disposed on an upper side of the second connection structure 150.

In the frame 110, rigidity of the first package structure 100 may further be improved depending on a detailed material of insulating layers 111a, 111b and 111c. Further, the frame 110 may serve to secure thickness uniformity of the encapsulant 130 and the like. The frame 110 has the recess 110H on which the stopper layer 112dM is disposed. The recess 110H penetrates through the insulating layers 111a, 111b and 111c. The recess 110H may only penetrate through a portion of the insulating layers 111a, 111b and 111c, depending on the position of the stopper layer 112dM. The semiconductor chip 120 is disposed in the recess 110H. The semiconductor chip 120 is disposed in a face-down manner on a drawing basis in such a manner that a surface thereof opposite to the surface on which the connection pad 120P is disposed faces the stopper layer 112dM.

The recess 110H may have a shape in which a wall surface thereof surrounds the semiconductor chip 120. The frame 110 includes wiring layers 112a, 112b, 112c and 112d and wiring via layers 113a, 113b and 113c in addition to the insulating layers 111a, 111b and 111c, thereby providing a vertical electrical connection path. A metal layer may be disposed on an inner wall surface of the recess 110H of the frame 110 to shield electromagnetic waves or dissipate heat as required, and the metal layer may surround the semiconductor chip 120.

The frame 110 may include a first insulating layer 111a, first and second wiring layers 112a and 112b disposed on upper and lower surfaces of the first insulating layer 111a, respectively, a first wiring via layer 113a penetrating through the first insulating layer 111a and electrically connecting the first and second wiring layers 112a and 112b, a second insulating layer 111b disposed on a lower surface of the first insulating layer 111a and covering the first wiring layer 112a, a third wiring layer 112c disposed on a lower surface of the second insulating layer 111b, a second wiring via layer 113b penetrating through the second insulating layer 111b and electrically connecting the first and third wiring layers 112a and 112c, a third insulating layer 111c disposed on the upper surface of the first insulating layer 111a and covering the second wiring layer 112b, a fourth wiring layer 112d disposed on the upper surface of the third insulating layer 111c, and a third wiring via layer 113c penetrating through the third insulating layer 111c and electrically connecting the second and fourth wiring layers 112b and 112d.

A material of the first to third insulating layers 111a, 111b and 111c is not particularly limited. For example, an insulating material may be used. As the insulating material, a thermosetting resin such as an epoxy resin, a thermoplastic resin such as polyimide, or a resin in which these resins are mixed with an inorganic filler, for example, Ajinomoto Build-up Film (ABF) may be used. Alternatively, a material in which the above-mentioned resin is impregnated with a core material such as glass fiber, glass cloth or glass fabric together with an inorganic filler, for example, a prepreg resin or the like may be used. A thickness of the first insulating layer 111a may be greater than a thickness of each of the second and third insulating layers 111b and 111c. The first insulating layer 111a may function as a core layer, and the second and third insulating layers 111b and 111c may function as a buildup layer. More layers or fewer layers of insulating layer may be introduced as required.

The first to fourth wiring layers 112a 112b 112c and 112d together with the first to third wiring via layers 113a, 113b and 113c provide a vertical electrical connection path in the first package structure 100. The first to fourth wiring layers 112a, 112b, 112c and 112d may be formed using a metal material such as copper (Cu), aluminum (Al), silver (Ag), tin (Sn), gold (Au), nickel (Ni), lead (Pb), titanium (Ti), or alloys thereof. The first to fourth wiring layers 112a, 112b, 112c and 112d may perform various functions depending on the design of the layer. For example, the first to fourth wiring layers 112a, 112b, 112c and 112d may each include power and/or ground patterns 112PG. The first to fourth wiring layers 112a, 112b, 112c and 112d may each include a signal pattern 112S. In this case, the signal pattern 112S includes various signals except for the power and/or ground patterns 112PG, for example, a data signal and the like. The ground pattern may be in the form of a planar surface, for example, a plane. The power pattern and the ground pattern may be the same pattern, and for example, may be provided as power and ground planes. The first to fourth wiring layers 112a, 112b, 112c and 112d may include various types of via pads and the like. The first to fourth wiring layers 112a, 112b, 112c and 112d may be formed by a known plating process, and may each include a seed layer and a plating layer. If necessary, more layers or fewer layers of wiring layers may be introduced.

A thickness of each of the first to fourth wiring layers 112a, 112b, 112c and 112d may be greater than a thickness of each of the first redistribution layers 142. For example, the frame 110 may have a thickness equal to or greater than the thickness of the semiconductor chip 120, and a prepreg or the like may be selected as the material of the insulating layers 111a, 111b, 111c and 112d to maintain rigidity. The thickness of the wiring layers 112*a*, 112*b*, 112*c* and 112*d* may be relatively great. On the other hand, the first connection structure 140 is required to have a microcircuit and a high-density design. Therefore, a photoimageable dielectric (PID) material is selected as a material of the first insulating layer 141, and the thickness of the first redistribution layer 142 may be relatively thin.

The stopper layer 112dM may be formed at the same time as the fourth wiring layer 112*d* and may therefore be located at substantially the same level as the fourth wiring layer 112*d*, which is merely an example. For example, the position of the stopper layer 112dM may vary depending on the depth of the recess 110H. For example, in a case in which the recess 110H is formed to only penetrate through the first and second insulating layers 111*a* and 111*b*, the stopper layer 112dM may be disposed at substantially the same level as the second wiring layer 112*b*. As a material of the stopper layer 112dM, a metal material such as copper (Cu), aluminum (Al), silver (Ag), tin (Sn), gold (Au), nickel (Ni), lead (Pb), titanium (Ti), or alloys thereof may be used. The stopper layer 112dM may also be formed by a plating process, and may be comprised of a seed layer and a conductor layer. The stopper layer 112dM may be a metal plate having a planar area greater than that of the second surface of the semiconductor chip 120, but an example embodiment thereof is not limited thereto.

The first to third wiring via layers 113*a*, 113*b* and 113*c* electrically connect the first to fourth wiring layers 112*a*, 112*b*, 112*c* and 112*d* formed in different layers, thereby forming an electrical path in the frame 110. The first to third wiring via layers 113*a*, 113*b* and 113*c* may be formed of a metal material such as copper (Cu), aluminum (Al), silver (Ag), tin (Sn), gold (Au), nickel (Ni), lead (Pb), titanium (Ti), or alloys thereof. The first to third wiring via layers 113*a*, 113*b* and 113*c* may include signal vias, power vias, ground vias, and the like, and the power vias and the ground vias may be the same vias. The wiring vias of each of the first to third wiring via layers 113*a*, 113*b* and 113*c* may be a via filled with a metal material, or may be a via conformally formed as a metal material is formed along a wall surface of a via hole. The wiring via of the first wiring via layer 113*a* may have an hourglass shape or a cylindrical shape. The wiring vias of the second and third wiring via layers 113*b* and 113*c* may have taper shapes tapered in opposite directions. The first to third wiring via layers 113*a*, 113*b* and 113*c* may be formed by a plating process, and each may be formed of a seed layer and a conductor layer. More or fewer layers of wiring via layers may be introduced as required.

The semiconductor chip 120 may be a packaged type chip based on an integrated circuit (IC) in which hundreds to millions of devices are integrated into a single chip. However, if necessary, the semiconductor chip 120 may be an integrated circuit in a bare state in which no separate bump or redistribution layer is formed on the integrated circuit. The integrated circuit may be formed based on an active wafer. In this case, as a base material constituting the body 120B of the semiconductor chip 120, silicon (Si), germanium (Ge), gallium arsenide (GaAs), or the like may be used. Various circuits may be formed in the body 120B. The connection pad 120P is provided to electrically connect the semiconductor chip 120 to other components. As a material of the connection pad 120P, a metal material such as copper (Cu), aluminum (Al) or the like may be used without any particular limitation. The through-vias 120T penetrate through at least a portion of a region between upper and lower surfaces of the body 120B. The through-vias 120T may be through-silicon vias (TSVs). A material of the through-vias 120T is not particularly limited, and a known conductive material may be used without any particular limitation. A passivation film exposing the connection pad 120P may be formed on the body 120B. The passivation film may be an oxide film, a nitride film or the like, or may be a double layer of an oxide film and a nitride film. An insulating film or the like may be further disposed on other necessary positions.

The semiconductor chip 120 may be an SoC-type AP chip including a central processing unit (CPU), a graphics processing unit (GPU), a neural processing unit (NPU), a digital signal processor unit (DSPU), and/or an image signal processing unit (ISPU) as a core unit. Even when an AP chip is used as the semiconductor chip 120, an optimized signal line may be designed through the wiring design and arrangement of the configurations as described above. Therefore, the semiconductor package 500 according to an example may be easily applied to an electronic device that requires a high specification.

The redistribution structure 125 may be disposed on the body 120B of the semiconductor chip 120. The connection pad 120P and the through-vias 120T may be respectively electrically connected to at least a portion of the one or more third redistribution layers 122. As a result, the connection pad 120P may be primarily redistributed through the third redistribution layers 122, and power and/or ground lines inside the body 120B may be common with each other through the third redistribution layers 122 and may then be redistributed to the backside of the semiconductor chip 120 through the through-vias 120T. At least a portion of sides of the body 120B may be substantially coplanar with at least a portion of sides of the redistribution structure 125. The encapsulant 130 may cover at least a portion of the side of the body 120B and at least a portion of the side of the redistribution structure 125. As described above, the semiconductor chip 120 may be a packaged die having a redistribution region even in a chip state.

The redistribution structure 125 includes a third insulating layer 121 disposed on the first surface of the body 120B, a third redistribution layer 122 disposed on the third insulating layer 121, and a third connection via 123 electrically connecting the connection pad 120P to the third redistribution layer 122 while penetrating through the third insulating layer 121. A portion of the third connection via 123 may electrically connect the through-via 120T to the third redistribution layer 122. The number of layers of the third insulating layer 121, the third redistribution layer 122, and the third connection via 123 may be larger than that illustrated in the drawing.

As a material of the third insulating layer 121, an insulating material may be used. In this case, a photoimageable dielectric (PID) material may be used as the insulating material. In this case, fine pitch may be introduced through the photovia, which is favorable for a fine circuit and a high-density design, to effectively redistribute the connection pad 120P and the through-via 120T. When the third insulating layer 121 has multiple layers, the boundaries therebetween may be distinct from each other, or the boundaries may be unclear.

The third redistribution layer 122 may primarily redistribute the connection pad 120P, and in addition, may allow the through-vias 120T to be common with each other. The third redistribution layer 122 may be formed using a metal material such as Cu, Al, Ag, Sn, Au, Ni, Pb, Ti, or alloys thereof. The third redistribution layer 122 may also perform various functions depending on the design thereof, and for example, may include a ground pattern, a power pattern, a signal pattern, and the like. The ground pattern may be in the form of a flat surface, for example, a plane. The power pattern and the ground pattern may be the same pattern, for example, power and ground planes. In addition, the third redistribution layer 122 may include various types of via pads, electrical connection metal pads, and the like. The third redistribution layer 122 may also be formed by a plating process, and may respectively be comprised of a seed layer and a conductor layer.

The third connection via 123 electrically connects the connection pad 120P and the third redistribution layer 122, and may also electrically connect the through-via 120T and the third redistribution layer 122. The third connection via 123 may be formed using a metal material such as copper (Cu), aluminum (Al), silver (Ag), tin (Sn), gold (Au), nickel (Ni), lead (Pb), titanium (Ti), or alloys thereof. The third connection via 123 may include signal vias, power vias, ground vias, and the like. The power vias and the ground vias may be the same vias. The third connection via 123 may also be a via filled with a metal material, respectively, or may also be a via conformally formed as a metal material is formed along a wall surface of a via hole, or may have a tapered shape. The third connection via 123 may also be formed by a plating process, and may be comprised of a seed layer and a conductor layer, respectively.

The encapsulant 130 covers at least a portion of each of the frame 110 and the semiconductor chip 120, and fills at least a portion of the recess 110H. The encapsulant 130 includes an insulating material, and examples of the insulating material may include a non-photoimageable dielectric material, in detail, a non-photoimageable dielectric material including an inorganic filler and an insulating resin, such as a thermosetting resin such as an epoxy resin, a thermoplastic resin such as polyimide, or a resin in which a reinforcing material such as an inorganic filler is contained in these resins, in more detail, a non-photoimageable dielectric material such as ABF or EMC. A material in which an insulating resin such as a thermosetting resin or a thermoplastic resin is impregnated with a core material such as an inorganic filler and/or a glass fiber may be used, as required. Thus, void and undulation problems may be reduced, and warpage control may be facilitated. If necessary, a Photo Imageable Encapsulant (PIE) may be used.

The metal member 135M may electrically connect the first and third redistribution layers 142 and 122. The metal member 135M may include a known metal material such as copper (Cu). The redistribution structure 125 may be separated from the first connection structure 140 by the metal member 135M. The encapsulant 130 may cover at least a portion of a side surface of the metal member 135M while being disposed between the redistribution structure 125 and the first connection structure 140.

The electrical connection member 135E may electrically connect the through-vias 120T and the stopper layer 112dM. The electrical connection member 135E may include a low melting point metal such as tin (Sn) or an alloy containing tin (Sn). For example, the electrical connection member 135E may be a solder ball, a solder bump or the like. The second surface of the semiconductor chip 120 and the stopper layer 112dM may be separated from each other by the electrical connection member 135E. The encapsulant 130 may cover at least a portion of the side surface of the electrical connection member 135E while being disposed between the second surface of the semiconductor chip 120 and the stopper layer 112dM.

The first connection structure 140 may redistribute the connection pad 120P. The connection pad 120P having various functions may be redistributed through the first connection structure 140, and may be physically and/or electrically connected externally of the first package structure 100 through the first and second electrical connection metals 175 and 290 depending on functions thereof. The first connection structure 140 includes a first insulating layer 141, a first redistribution layer 142 disposed on a lower surface of the first insulating layer 141, and a first connection via 143 connected to the redistribution layer 142 while penetrating through the first insulating layer 141. The first insulating layer 141, the first redistribution layer 142, and the first connection via 143 may be more or smaller than those illustrated in the drawing in the amount thereof. For example, the number of layers may change depending on the design thereof.

As a material of the first insulating layer 141, an insulating material may be used. In this case, a photoimageable dielectric (PID) material may be used as the insulating material. In this case, a fine pitch may be introduced through the photovia, which is favorable for a fine circuit and high-density design, to redistribute the connection pad 120P effectively. A boundary between the first insulating layers 141 may be distinct from each other, and the boundaries may be unclear.

The first redistribution layer 142 may redistribute the connection pad 120P to electrically connect the connection pad 120P to the first electrical connection metal 175. As a material of the first redistribution layer 142, a metal material such as copper (Cu), aluminum (Al), silver (Ag), tin (Sn), gold (Au), nickel (Ni), lead (Pb), titanium (Ti) or alloys thereof may also be used. The first redistribution layer 142 may also perform various functions depending on the design. For example, the first redistribution layer 142 may respectively include a power and/or ground pattern 142PG. In addition, the first redistribution layer 142 may respectively include first and second signal patterns 142S1 and 142S2. The ground pattern may be in the form of a flat surface, for example, a plane. The power pattern and the ground pattern may be the same pattern, and for example, power and ground planes. The first redistribution layer 142 may include various types of via pads, electrical connection metal pads, and the like. The first redistribution layer 142 may be formed by a plating process, and may be respectively comprised of a seed layer and a conductor layer.

The first connection via 143 electrically connects the first redistribution layers 142 formed in different layers, and in addition, may electrically connect the connection pad 120P of the semiconductor chip 120 and the third wiring layer 112c of the frame 110 to the first redistribution layer 142. The first connection via 143 may also be formed using a metal material such copper (Cu), aluminum (Al), silver (Ag), tin (Sn), gold (Au), nickel (Ni), lead (Pb), titanium (Ti), or alloys thereof. The first connection via 143 may include signal vias, power vias, ground vias, and the like. The power vias and ground vias may be the same vias. The first connection via 143 may also be a via filled with a metal material, or may be a via conformally formed as a metal material is formed along a wall surface of a via hole, and in addition, may have a tapered shape. The first connection via 143 may also be formed by a plating process, and may be respectively comprised of a seed layer and a conductor layer.

The second connection structure 150 may redistribute the power and/or ground of the semiconductor chip 120. The power and/or ground of the semiconductor chip 120 may be redistributed through the through-via 120T and the second connection structure 150, and may be physically and/or electrically connected externally of the first package structure 100 through the first electrical connection metal 175 or the like depending on functions thereof. The second connection structure 150 includes a second insulating layer 151, the second redistribution layer 152 disposed on an upper surface of the second insulating layer 151, and a second connection via 153 penetrating through the second insulating layer 151 to be connected to the second redistribution layer 152. The second insulating layer 151, the second redistribution layer 152, and the second connection via 153 may be more or smaller than those illustrated in the drawing in the amount thereof. For example, the number of layers may change depending on the design thereof.

As a material of the second insulating layer 151, an insulating material may be used. In this case, a photoimageable dielectric (PID) material may be used as the insulating material. In this case, a fine pitch may be introduced through the photovia, which is favorable for a fine circuit and high-density design, to effectively redistribute the power and/or ground of the semiconductor chip 120. When the second insulating layer 151 has multiple layers, the boundaries therebetween may be distinct from each other, and the boundaries may be unclear.

The second redistribution layer 152 may redistribute the power and/or ground of the semiconductor chip 120, and in addition, may redistribute the signal transmitted through the second connection pad 120P2 of the semiconductor chip 120. The second redistribution layer 152 may also be formed using a metal material such as copper (Cu), aluminum (Al), silver (Ag), tin (Sn), gold (Au), nickel (Ni), lead (Pb), titanium (Ti) or alloys thereof. The second redistribution layer 152 may also perform various functions depending on the design. For example, the second redistribution layer 152 may include a power and/or ground pattern 152PG. In addition, the second redistribution layer 152 may include a signal pattern 152S. The ground pattern may be in the form of a flat surface, for example, a plane. The power pattern and the ground pattern may be the same pattern, and for example, may be power and ground planes. In addition, the second redistribution layer 152 may include various types of via pads, electrical connection metal pads, and the like. The second redistribution layer 152 may also be formed by a plating process, and may be comprised of a seed layer and a conductor layer.

The second connection via 153 electrically connects the stopper layer 112dM and the fourth wiring layer 112d of the frame 110 to the second redistribution layer 152. The second connection via 153 may be formed using a metal material such copper (Cu), aluminum (Al), silver (Ag), tin (Sn), gold (Au), nickel (Ni), lead (Pb), titanium (Ti), or alloys thereof. The second connection via 153 may include signal vias, power vias, ground vias, and the like. The power vias and the ground vias may be the same vias. The second connection via 153 may also be a via filled with a metal material, or may be a via conformally formed as a metal material is formed along a wall surface of a via hole, and in addition, may have a tapered shape. The second connection via 153 may also be formed by a plating process, and may be respectively comprised of a seed layer and a conductor layer.

The first connection structure 140 includes a first region R1 overlapping the semiconductor chip 120 on a plane and a second region R2 surrounding the first region R1 and overlapping the frame 110 on a plane. In this case, signal patterns 142S1 and 142S2 are mainly designed in the first region R1 corresponding to a fan-in region, and power and/or ground patterns 142PG may be mainly designed in the second region R2 corresponding to a fan-out region, by the first redistribution layer 142. In addition, power and/or ground patterns 152PG may be mainly designed by the second redistribution layer 152 of the second connection structure 150. In this case, 'the pattern being mainly designed' means that it is designed to occupy an area of 50% or more or an area of 90% or more, on a planar basis. In this case, connection pads 120P1 and 120P2 for signal connection among the connection pads 120P of the semiconductor chip 120 may be redistributed through the signal patterns 142S1 and 142S2 of the first redistribution layer 142. In addition, the power and/or ground of the semiconductor chip 120 may be electrically connected to the power and/or ground patterns 152PG of the second redistribution layer 152 through the through-vias 120T and may thus be redistributed. In this case, the connection pad 120P of the semiconductor chip 120 may be designed mainly for signal connection. Also, the connection pads 120P1 and 120P2 for signal connection may be redistributed through the signal patterns 142S1 and 142S2 disposed in the region corresponding to the fan-in region of the first redistribution layer 142. As a result, an optimized signal line may be designed.

The first redistribution layer 142 may include the first signal pattern 142S1 in the first region R1 and the second signal pattern 142S1 in the region R3 extending from the first region R1 to the second region R2, and may include the power and/or ground pattern 142PG in the second region R2. The connection pad 120P may include the first connection pad 120P1 electrically connected to the first signal pattern 142S1 and the second connection pad 120P2 electrically connected to the second signal pattern 142S2. The first connection pad 120P1 may be redistributed through the first signal pattern 142S1 in the first region R1. The second connection pad 120P2 may be redistributed from the first region R1 to the second region R2 through the second signal pattern 142S2. In the first connection structure 140, the first and second signal patterns 142S1 and 142S2 may be disconnected from each other, and for example, may not be connected to each other within the first connection structure 140. The first signal pattern 142S1 may be a pattern for signal connection between the semiconductor chip 120 and an external semiconductor chip and/or a component. The second signal pattern 142S2 may be a pattern for signal connection between the semiconductor chip 120 and the semiconductor chip 220 of the second package structure 200 to be described later. In this case, the first connection pad 120P1 may be redistributed through a path PO passing through the first signal pattern 142S1 in the first region, for example, vertically. The second connection pad 120P2 and the signal pattern 152S of the second redistribution layer 152 may be electrically connected to each other by an electrical path P1 passing through the second signal pattern 142S2 and the plurality of wiring layers 112a, 112b, 112c and 112d in order, or vice versa. In addition, the power and/or ground patterns 142PG of the second region R2 of the first redistribution layer 142 and the through-vias 120T of the semiconductor chip 120 may be electrically connected to each other by an electrical path P2 passing through power and/or ground patterns 112PG of the plurality of wiring layers 112a, 112b, 112c and 112d, the power and/or ground patterns 152PG of the second redistribution layer 152 and the stopper layer 112dM in order or vice versa. In this manner, the first and second signal patterns 142S1 and 142S2 may be separately designed depending on functions thereof, and thus, an optimum electrical path may be provided. Also, power and/or ground of the semiconductor chip 120 may be redistributed through a backside path of the semiconductor chip 120. As a result, an optimized signal line may be designed more effectively.

The number of layers of the second redistribution layer 152 may be the same as or may be greater than the number of layers of the first redistribution layer 142. In this case, by concentrating the power and/or ground design on the backside with respect to the semiconductor chip 120, a front side design based on the semiconductor chip 120 may be simplified.

The first passivation layer 160 is an additional structure for protecting the first connection structure 140 from external physical chemical damage or the like. The first passivation layer 160 may include a thermosetting resin. For example, the first passivation layer 160 may be ABF, but is not limited thereto. The first passivation layer 160 may have an opening that exposes at least a portion of a lowermost first redistribution layer 142. The number of openings may be tens to millions, and may have more or less numbers. Each opening may be comprised of a plurality of holes.

The first electrical connection metal 175 is also an additional configuration, and is a configuration for physically and/or electrically connecting the semiconductor package 500 according to an example externally. For example, the semiconductor package 500 according to an example may be mounted on a main board of an electronic device through the first electrical connection metal 175. The first electrical connection metal 175 may be respectively disposed on the opening of the first passivation layer 160. The first electrical connection metal 175 may respectively be formed of a low melting point metal, for example, tin (Sn) or an alloy containing tin (Sn). For example, the first electrical connection metal 175 may be formed of a solder or the like, but this is merely an example, and thus, the material thereof is not limited thereto.

The first electrical connection metal 175 may be a land, a ball, a pin, or the like. The first electrical connection metal 175 may be formed of multiple layers or a single layer. The first electrical connection metal 175 may include a copper pillar and a solder when it is formed of multiple layers, and may include tin-silver solder or copper when formed as a single layer, but embodiments thereof are not limited thereto. The number, spacing, arrangement, and the like of the first electrical connection metal 175 are not particularly limited and may be sufficiently modified according to the design specifications of an ordinary person skilled in the art. For example, the number of first electrical connection metals 175 may be from tens to millions, and may be more or less.

At least one of first electrical connection metals 175 is disposed in a fan-out region. The fan-out region refers to an area outside the area in which the semiconductor chip 120 is disposed. The fan-out package is more reliable than the fan-in package, allows multiple I/O terminals to be implemented, and facilitates 3D interconnection. Compared with a Ball Grid Array (BGA) package and a Land Grid Array (LGA) package, a fan-out package may be manufactured to have a relatively reduced thickness and may have excellent price competitiveness.

The first electrical connection metal 175 includes a 1-1 electrical connection metal 175S disposed in a region overlapping the first region R1 on a plane and electrically connected to the first signal pattern 142S1, and a 1-2 electrical connection metal 175PG disposed in a region overlapping the second region R2 on a plane and electrically connected to the power and/or ground pattern 142PG of the second region R2. Thus, the signal may be electrically connected to the electronic device or the like mainly in the fan-in region, and the power and/or ground may be electrically connected to the electronic device or the like in the fan-out region.

The first electrical connection metal 175 may be connected to a lowermost first redistribution layer 142 through the under-bump metal 170 as required, and in this case, connection reliability of the first electrical connection metal 175 may be improved. As a result, board level reliability of the semiconductor package 500 may be improved. The under-bump metal 170 may be formed using a metal such as copper (Cu), titanium (Ti) or the like by a known metallization method, but an example embodiment thereof is not limited thereto.

The second passivation layer 180 is an additional structure for protecting the second connection structure 150 from external physical chemical damage or the like. The second passivation layer 180 may include a thermosetting resin. For example, the second passivation layer 180 may be ABF, but is not limited thereto. The second passivation layer 180 may have an opening that exposes at least a portion of an uppermost second redistribution layer 152. The number of openings may be tens to millions, and may have more or less numbers. Each opening may be comprised of a plurality of holes.

The passive component 190 may be a known chip type component. For example, the passive component 190 may be a chip-type capacitor or a chip-type inductor. In detail, the passive component 190 may be a chip-type low inductance chip capacitor (LICC). The number of passive components 190 is not particularly limited. The passive component 190 may be surface mounted on the second passivation layer 180. The passive component 190 may be electrically connected to the power and/or ground pattern 152PG of the second redistribution layer 152, and as a result, may be electrically connected to the electrical path P2 for the above-mentioned power and/or ground, thereby providing more stable electrical characteristics to the electrical path P2 for power and/or ground.

The second package structure 200 includes the semiconductor chip 220 as described above. The second package structure 200 includes, for example, a circuit board 210 including one or more circuit layers 212, at least one semiconductor chip 220 disposed above the circuit board 210 and electrically connected to the circuit layer 212 through a bonding wire 220W, a molding material 230 covering at least a portion of the semiconductor chip 220, and a second electrical connection metal 290 disposed below the circuit board 210 and electrically connected to the circuit layer 212.

The circuit board 210 may be a known printed circuit board (PCB). For example, the circuit board 210 may be a known Ball Grid Array (BGA) substrate. The circuit board 210 may be a core type substrate or a coreless type substrate.

The semiconductor chip 220 may be a memory chip such as a volatile memory (dynamic random access memory (DRAM)), a non-volatile memory (read only memory (ROM)), a flash memory, or the like. For example, the semiconductor chip 220 may be a plurality of stack memories. The connection pad of each semiconductor chip 220 may be electrically connected to the circuit layer 212 of the circuit board 210 through the bonding wire 220W. The bonding wire 220W may be a metal wire, such as a copper wire or a gold wire. The semiconductor chip 220 may be an integrated circuit (IC) in which hundreds to millions of devices are integrated into one chip. The semiconductor chip 220 may be attached to the circuit board 212 via an adhesive member, or may be stacked vertically.

The molding material 230 covers at least a portion of each of each semiconductor chip 220. The molding material 230 includes an insulating material, and examples of the insulating material may include a non-photoimageable dielectric material, in detail, a non-photoimageable dielectric material including an inorganic filler and an insulating resin, such as a thermosetting resin such as an epoxy resin, a thermoplastic resin such as polyimide, or a resin in which a reinforcing material such as an inorganic filler is contained in these resins, in more detail, a non-photoimageable dielectric material such as ABF or EMC. A material in which an insulating resin such as a thermosetting resin or a thermoplastic resin is impregnated with a core material such as an inorganic filler and/or a glass fiber may be used, as required. Thus, void and undulation problems may be reduced, and warpage control may be facilitated. If necessary, a Photo Imageable Encapsulant (PIE) may be used.

The second electrical connection metal 290 is a configuration physically and/or electrically connecting the first and second package structures 100 and 200. The second electrical connection metal 290 may respectively be formed of a low melting point metal, for example, tin (Sn) or an alloy containing tin (Sn). For example, the second electrical connection metal 290 may be formed of a solder or the like, but this is merely an example and the material thereof is not limited thereto. The second electrical connection metal 290 may be a land, a ball, a pin, or the like. The second electrical connection metal 290 may be formed of multiple layers or a single layer. The second electrical connection metal 290 may include a copper pillar and a solder when it is formed of multiple layers, and may include a tin-silver solder or copper when formed as a single layer, but examples thereof is not limited thereto. The number, spacing, arrangement type and the like of the second electrical connection metal 290 are not particularly limited and may be sufficiently modified according to design specifications by an ordinary person skilled in the art.

As set forth above, according to an example embodiment, a semiconductor package in which a yield may be improved and a manufacturing cost may be reduced may be provided.

According to an example embodiment, a semiconductor package in which an optimized signal line may be designed may be provided.

In the present inventive concept, the lower side, the lower portion, the lower surface and the like refer to the downward direction with respect to the cross section of the drawings for convenience, and the upper side, the upper portion, and the upper surface are used in the opposite direction. It should be noted, however, that this is a definition of a direction for the sake of convenience of explanation, and the scope of rights of the claims is not particularly limited by description of such direction.

The meaning of being connected in the present inventive concept encompasses not only a direct connection, but also includes an indirect connection. In addition, the term "electrically connected" means a concept including both a physical connection and non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

The expression, an example, used in this inventive concept does not mean the same embodiment, but is provided for emphasizing and explaining different unique features.

However, the above-mentioned examples do not exclude being implemented in combination with the features of other examples. For example, although the description in the specific example is not described in another example, it may be understood as an explanation related to another example, unless otherwise described or contradicted by the other example.

The terms used in this inventive concept are only used to illustrate an example and are not intended to limit the present inventive concept. The singular expressions include plural expressions unless the context clearly dictates otherwise.

What is claimed is:

1. A semiconductor package comprising:
   a frame having a plurality of wiring layers electrically connected to each other and having a recess on which a stopper layer is disposed;
   a semiconductor chip including a body having a first surface on which a connection pad is disposed and a second surface opposing the first surface, and a through-via penetrating through at least a portion of a region between the first surface and the second surface of the body, the second surface facing the stopper layer;
   an encapsulant covering at least a portion of each of the frame and the semiconductor chip and filling at least a portion of the recess;
   a first connection structure disposed on a lower side of the frame and on the first surface of the semiconductor chip and including one or more first redistribution layers; and
   a second connection structure disposed on an upper side of the frame and on the second surface of the semiconductor chip and including one or more second redistribution layers,
   wherein on a plane, the first connection structure comprises a first region overlapping the semiconductor chip, and a second region surrounding the first region and overlapping the frame, and
   the one or more first redistribution layers comprise a first signal pattern in the first region, a second signal pattern in a region extending from the first region to the second region, and at least one of a power pattern and a ground pattern in the second region.

2. The semiconductor package of claim 1, wherein the first and second signal patterns are disconnected from each other in the first connection structure.

3. The semiconductor package of claim 2, wherein the connection pad comprises a first connection pad electrically connected to the first signal pattern and a second connection pad electrically connected to the second signal pattern,
   the first connection pad is redistributed in the first region through the first signal pattern, and the second connection pad is redistributed from the first region to the second region through the second signal pattern.

4. The semiconductor package of claim 3, wherein the plurality of wiring layers comprise at least one of a power pattern and a ground pattern,
   the one or more second redistribution layers comprise at least one of a power pattern and a ground pattern, and
   at least one of the power pattern and the ground pattern of the second region, and the through-via, are electrically connected to each other by an electrical path passing through at least one of the power pattern and the ground pattern of the plurality of wiring layers, at least one of the power pattern and the ground pattern of the one or more second redistribution layers, and the stopper layer in order, or vice versa.

5. The semiconductor package of claim 4, further comprising a passive component disposed above the second connection structure,
  wherein the passive component is electrically connected to at least one of the power pattern and the ground pattern of the one or more second redistribution layers.

6. The semiconductor package of claim 4, wherein the plurality of wiring layers further comprise a signal pattern,
  the one or more second redistribution layers further comprise a signal pattern, and
  signal patterns of the second connection pad and the one or more second redistribution layers are electrically connected to each other, through an electrical path passing through the second signal pattern and the signal pattern of the plurality of wiring layers in order or vice versa.

7. The semiconductor package of claim 6, further comprising a memory structure disposed above the second connection structure and including at least one memory chip,
  wherein the memory structure is disposed on the second connection structure via an electrical connection metal in a package-on-package form, and
  wherein the at least one memory chip is electrically connected to the signal pattern of the one or more second redistribution layers.

8. The semiconductor package of claim 7, wherein the semiconductor chip is an application processor (AP) chip.

9. The semiconductor package of claim 1, further comprising an electrical connection metal disposed below the first connection structure,
  wherein the electrical connection metal comprises a first electrical connection metal disposed in a region overlapping the first region on the plane and electrically connected to the first signal pattern, and a second electrical connection metal disposed in a region overlapping the second region on the plane and electrically connected to at least one of the power and ground patterns of the second region.

10. The semiconductor package of claim 1, wherein the semiconductor chip further comprises a redistribution structure disposed on the first surface of the body and including one or more third redistribution layers, and
  the connection pad and the through-via are respectively electrically connected to at least a portion of the one or more third redistribution layers.

11. The semiconductor package of claim 10, wherein at least a portion of a side of the body is substantially coplanar with at least a portion of a side of the redistribution structure, and
  the encapsulant covers at least the portion of the side of the body and at least the portion of the side of the redistribution structure.

12. The semiconductor package of claim 10, further comprising a metal member disposed between the redistribution structure and the first connection structure and electrically connecting the one or more first redistribution layers and the one or more third redistribution layers,
  wherein the encapsulant is disposed between the redistribution structure and the first connection structure to cover at least a portion of a side surface of the metal member.

13. The semiconductor package of claim 1, further comprising an electrical connection member disposed between the second surface of the semiconductor chip and the stopper layer and electrically connecting the through-vias and the stopper layer to each other,
  wherein the encapsulant disposed between the second surface of the semiconductor chip and the stopper layer to cover at least a portion of a side surface of the electrical connection member.

14. The semiconductor package of claim 1, wherein the frame comprises a first insulating layer, a first wiring layer and a second wiring layer disposed on a lower surface and an upper surface of the first insulating layer, respectively, a first wiring via layer penetrating through the first insulating layer and electrically connecting the first and second wiring layers to each other, a second insulating layer disposed on the lower surface of the first insulating layer and covering the first wiring layer, a third wiring layer disposed on a lower surface of the second insulating layer, a second wiring via layer penetrating through the second insulating layer and electrically connecting the first and third wiring layers to each other, a third insulating layer disposed on the upper surface of the first insulating layer and covering the second wiring layer, a fourth wiring layer disposed on an upper surface of the third insulating layer, and a third wiring via layer penetrating through the third insulating layer and electrically connecting the second and fourth wiring layers to each other,
  wherein a thickness of the first insulating layer is greater than a thickness of each of the second and third insulating layers.

15. The semiconductor package of claim 14, wherein the stopper layer is located on substantially the same level as the fourth wiring layer.

16. A semiconductor package comprising:
  a first connection structure and a second connection structure each having one or more redistribution layers;
  a frame disposed between the first and second connection structures, and having a recess exposing a conductive layer partially embedded in the second connection structure;
  a semiconductor chip disposed in the recess, and including a body having a first surface on which connection pads are disposed and a second surface opposing the first surface, and a through-via penetrating through the body and connected to the conductive layer through an electrical connection member disposed between the through via and the conductive layer, the second surface facing the stopper layer;
  an encapsulant filling at least a portion of the recess, and disposed between the second surface and the conducive layer;
  a first electrical connection metal disposed on a lower surface of the first connection structure in a fan-in region of the semiconductor package, and connected to a signal pad among the connection pads; and
  a second electrical connection metal disposed on the lower surface of the first connection structure in a fan-out region of the semiconductor package, and connected to the through-via at least through the one or more redistribution layers of the first connection member, a wiring structure in the frame, the one or more redistribution layers of the second connection member, the conductive layer, and the electrical connection member in order or vice versa.

17. The semiconductor package of gclaim 16, wherein the second electrical connection metal is configured to supply power to the semiconductor chip at least through the one or more redistribution layers of the first connection member, the wiring structure in the frame, the one or more redistribution layers of the second connection member, the conductive layer, and the electrical connection member in order.

18. The semiconductor package of claim 16, further comprising:
- a circuit board;
- a second semiconductor chip disposed on the circuit board; and
- a third electrical connection metal disposed between the circuit board and the second connection member and connecting the circuit board and the second connection member to each other,
- wherein a signal pad among the connection pads is connected to the second semiconductor chip at least through a pattern of the one or more redistribution layers of the first connection member extending over the recess, a wiring structure of the frame, the one or more redistribution layers of the second connection member, the third electrical connection metal.

19. A semiconductor package comprising:
- a frame having a plurality of wiring layers electrically connected to each other and having a recess on which a stopper layer is disposed;
- a semiconductor chip including a body having a first surface on which a connection pad is disposed and a second surface opposing the first surface, and a through-via penetrating through at least a portion of a region between the first surface and the second surface of the body, the second surface facing the stopper layer;
- an encapsulant covering at least a portion of each of the frame and the semiconductor chip and filling at least a portion of the recess;
- a first connection structure disposed on a lower side of the frame and on the first surface of the semiconductor chip and including one or more first redistribution layers; and
- a second connection structure disposed on an upper side of the frame and on the second surface of the semiconductor chip and including one or more second redistribution layers,
- wherein the frame comprises a first insulating layer, a first wiring layer and a second wiring layer disposed on a lower surface and an upper surface of the first insulating layer, respectively, a first wiring via layer penetrating through the first insulating layer and electrically connecting the first and second wiring layers to each other, a second insulating layer disposed on the lower surface of the first insulating layer and covering the first wiring layer, a third wiring layer disposed on a lower surface of the second insulating layer, a second wiring via layer penetrating through the second insulating layer and electrically connecting the first and third wiring layers to each other, a third insulating layer disposed on the upper surface of the first insulating layer and covering the second wiring layer, a fourth wiring layer disposed on an upper surface of the third insulating layer, and a third wiring via layer penetrating through the third insulating layer and electrically connecting the second and fourth wiring layers to each other, and
- wherein a thickness of the first insulating layer is greater than a thickness of each of the second and third insulating layers.

20. The semiconductor package of claim 19, wherein the stopper layer is located on substantially the same level as the fourth wiring layer.

* * * * *